United States Patent [19]

Morton

[11] Patent Number: 4,683,423
[45] Date of Patent: Jul. 28, 1987

[54] LEADLESS CHIP TEST SOCKET

[75] Inventor: William D. Morton, Santa Clara, Calif.

[73] Assignee: Precision Monolithics, Inc., Santa Clara, Calif.

[21] Appl. No.: 792,805

[22] Filed: Oct. 30, 1985

[51] Int. Cl.[4] .................. G01R 31/26; H01R 9/09
[52] U.S. Cl. .................. 324/158 F; 439/71; 439/165
[58] Field of Search ............ 324/158 F; 339/17 CF, 339/75 MP, 75 M, 176 MP, 176 M; 174/52 FP

[56] References Cited

U.S. PATENT DOCUMENTS

| | | | |
|---|---|---|---|
| 3,904,262 | 9/1975 | Cutchaw | 339/17 |
| 3,942,854 | 3/1976 | Klein et al. | 339/17 |
| 4,026,412 | 5/1977 | Henson | 206/331 |
| 4,330,163 | 5/1982 | Aikens et al. | 339/17 |
| 4,331,373 | 5/1982 | Demnianiuk | 339/91 |
| 4,376,560 | 3/1983 | Olsson et al. | 339/17 |
| 4,444,309 | 4/1984 | Morton, Jr. | 206/329 |
| 4,461,524 | 7/1984 | McGhee | 339/75 MP |
| 4,473,266 | 9/1984 | Soltysik et al. | 339/75 M |
| 4,498,047 | 2/1985 | Hexamer et al. | 324/158 |
| 4,504,105 | 3/1985 | Barkus et al. | 339/75 |
| 4,515,425 | 5/1985 | Nakano | 339/75 MP |
| 4,554,505 | 11/1985 | Zachry | 339/17 CF |

Primary Examiner—Reinhard J. Eisenzopf
Assistant Examiner—Stephen M. Baker
Attorney, Agent, or Firm—Koppel & Harris

[57] ABSTRACT

A test socket for a leadless chip carrier is disclosed in which a clamp is pivotally mounted to a base member, such that the carrier can be inserted into a recess in the base member and the clamp pivoted closed to lock the carrier in place. The clamp includes a set of arms which engage corresponding brackets on the base to progressively secure the carrier and chip as the clamp is rotated either clockwise or counterclockwise. The clamp makes direct contact with the chip to assure a good electrical connection with underlying electrical contact springs.

22 Claims, 8 Drawing Figures

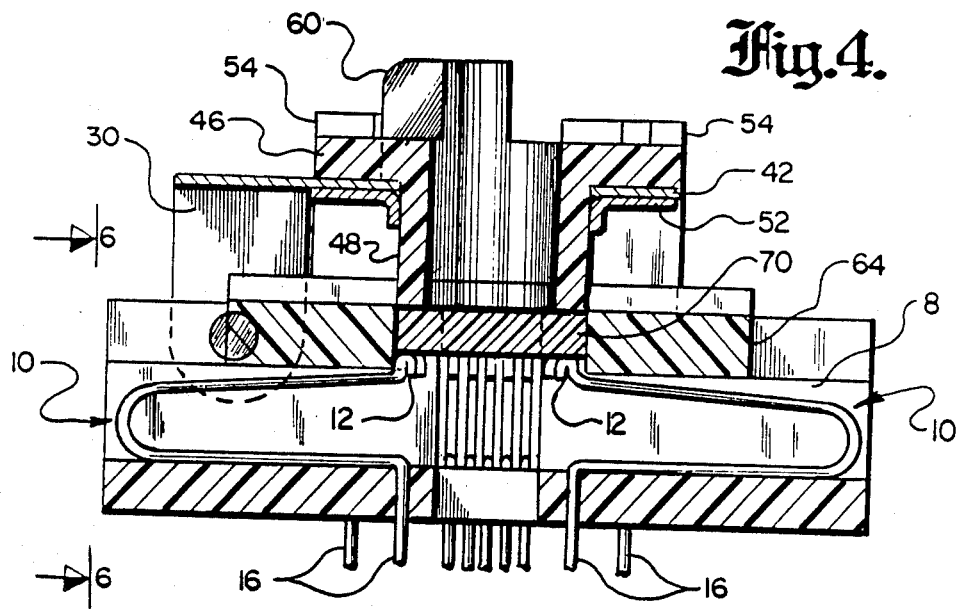
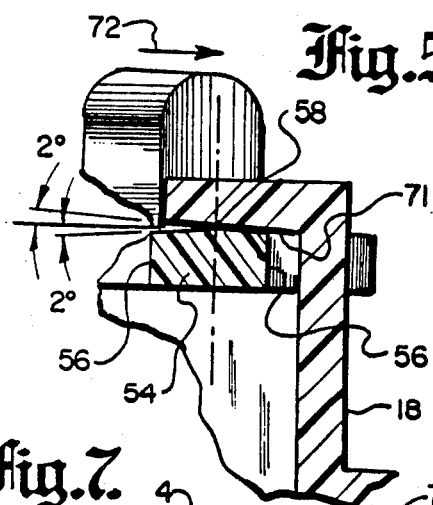
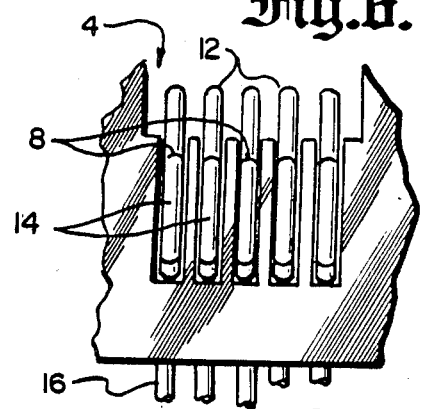
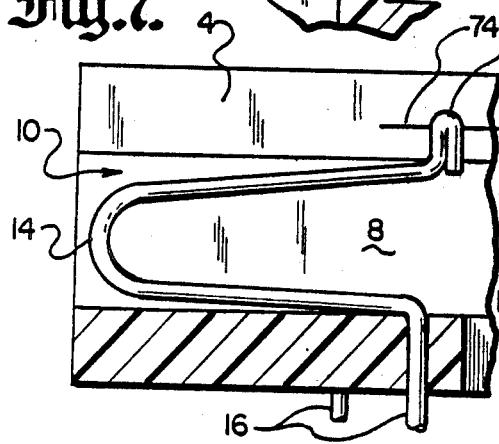
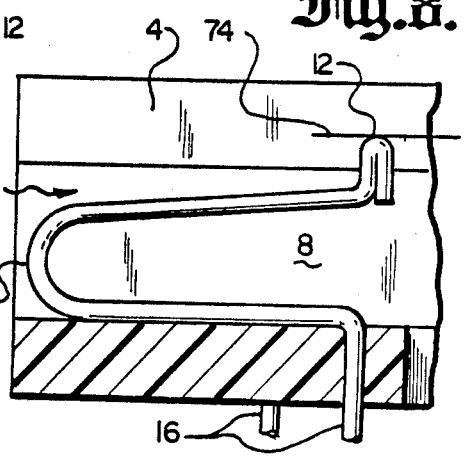

4,683,423

LEADLESS CHIP TEST SOCKET

BACKGROUND OF THE INVENTION

1. Field of the Invention

This invention relates to test sockets adapted to hold and establish electrical contact with electronic components for testing, and more particularly to a test socket for a leadless chip which is housed in a carrier.

2. Description of the Prior Art

Various carrier devices for leadless integrated circuit chips have been developed to hold the chip during manufacturing operations. One such leadless chip carrier is disclosed in U.S. Pat. No. 4,444,309, issued Apr. 24, 1984 to the present inventor and currently assigned to the assignee of the present invention. However, these carriers are not compatible with available test sockets that are permanently mounted on a printed circuit board. Such test sockets have contact devices that are adapted to establish electrical contact with the contact pads on the surface of the chip, permitting various test sequences in which the chip circuitry is exercised and its performance is monitored via the test socket contacts. With presently available carriers and test sockets, the chip must be first removed from the carrier and inserted into the test socket in a "naked" state, and then removed from the socket after testing and reinserted into a carrier if further processing is desired. This introduces additional steps into the testing cycle with an accompanying increase in cost and reduction in efficiency, and the extra handling of the chip increases the possibility of its being damaged.

SUMMARY OF THE INVENTION

In view of the above problems associated with the prior art, the object of the present invention is to provide a novel and improved test socket for leadless integrated circuit chips that is capable of accommodating a chip while it is still housed in a carrier, thereby eliminating the need to remove the chip from the carrier prior to loading in the socket.

Another object is the provision of such a test socket which securely holds the chip and its carrier, and establishes positive electrical connections with the chip contact pads.

These and other objects are accomplished in the present invention by the provision of a test socket which includes a base member adapted to receive a leadless chip housed in a carrier, with the exposed chip contact pads facing downward towards the base. A plurality of spring biased contact members extend upward from within the base to establish electrical contact with respective contact pads on the chip. A clamp is pivotably attached to the base and pivots between an open position permitting the top loading of a carrier into the base, and a closed position securing the carrier in the base. A plurality of spaced projecting members extend upward from the base and cooperate with the clamp to releasably clamp the carrier in the test socket with the chip contact pads engaging the test socket's contact members.

In a preferred embodiment the clamp comprises a rotatable member having an upper engagement surface, and the projecting members comprise brackets which extend upward from the base around the periphery of the carrier receiving area. Generally downward facing bearing surfaces on the brackets are engaged by the upper engagement surfaces on the clamp when the clamp is rotated, forcing the clamp down to a fully closed position at which positive electrical connections are established with the chip contact pads. The mutually engaged clamp and bracket surfaces are mutually inclined to the clamp rotational plane, thus forcing the clamp downwards as it is rotated under the bearing surfaces. The upper clamp engagement surface is formed on a set of arms which extend outward from the body of the clamp. The upper arm surfaces taper downward from an intermediate location between the arm side walls, such that a clamping action is effected for either clockwise or counterclockwise rotation of the clamp. The clamp includes a post which extends through an opening in the carrier and bears directly against the upper side of the chip.

The clamp is preferably mounted on a pivot member which pivots with respect to the base to move the clamp between open and closed positions. A finger grip is provided on the clamp to facilitate its rotation. The clamp includes an opening to provide an ambient temperature source for the chip.

Other features and objects of the invention will be apparent to those skilled in the art from the following detailed description of a preferred embodiment, taken together with the accompanying drawings, in which:

DESCRIPTION OF THE DRAWINGS

FIG. 4 is a sectional view taken along the line 4—4 of FIG. 3;

FIG. 5 is an enlarged fragmentary sectional view showing a portion of the test socket's clamping mechanism;

FIG. 6 is a fragmentary left side elevation view taken along the line 6—6 of FIG. 4; and FIGS. 7 and 8 are sectional views showing one of the test socket's electrical contacts respectively before and during contact with a leadless chip in the carrier.

DETAILED DESCRIPTION OF A PREFERRED EMBODIMENT

Figure 1:
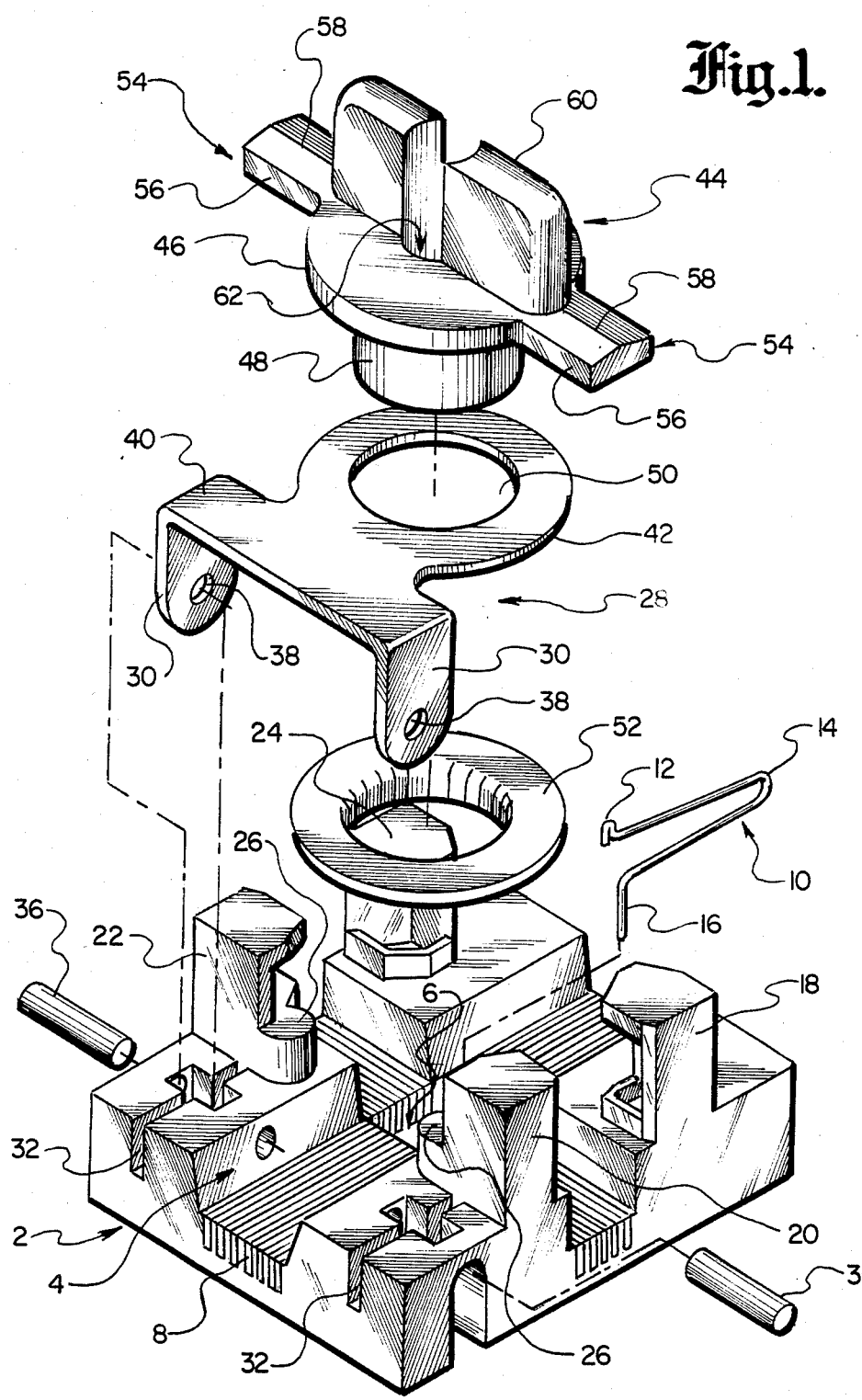
FIG. 1 is an exploded perspective view of a test socket for a leadless chip carrier constructed in accordance with the invention.

An exploded view of a test socket for a leadless chip carrier assembly constructed in accordance with the invention is shown in FIG. 1. The test socket is intended to be mounted on a printed circuit board having footprint pads which match contacts protruding from the base of the test socket. To assure good electrical contact, the test socket contacts are preferably soldered to each of the pads on the printed circuit board. The test socket includes a base member 2 with a recess 4 adapted to receive a leadless chip carrier assembly, the assembly including a leadless integrated circuit chip and a carrier housing the chip. The test socket of FIG. 1 is designed to accommodate a leadless chip carrier of the type illustrated in U.S. Pat. No. 4,444,309, with the carrier fitting snugly within recess 4 and held by the recess walls against substantial lateral movement. With the orientation shown in the figure, the chip carrier would be placed within recess 4 so that the chip's contact pads are facing down towards the floor of the recess. As used herein, terms such as "down" and "up" are intended for purposes of reference only, it being understood that the test socket could be inverted or operated at some other angular orientation and still function satisfactorily.

An opening 6 is provided in the recess floor at the center of base 2 to expose the chip to the ambient atmosphere and temperature on the underside of the test socket. The test socket base includes a series of partitions 8 which extend upward from the floor of recess 4 and run the length of the recess (except for opening 6). Adjacent partitions are separated by gaps within which spring biased contact members 10 are disposed. A separate contact member 10 is provided in the socket for each contact pad on the leadless chip to be tested. Each contact spring includes a head 12 which extends upward above the level of partitions 8 to establish physical and electrical contact with a chip contact pad, a spring section 14 which is lodged between adjacent partitions and provides a spring pressure to hold the head up above the partitions, and a pin 16 which extends through the test socket base for engagement with a printed circuit board. The contact springs are each preferably formed from a single continuous section of spring wire.

Four brackets 18, 20, 22 and 24 are molded integrally with the base 2 and extend upward therefrom on opposite sides of recess 4. Each of the brackets is undercut at its top to form a bearing surface which is used to clamp a chip carrier within the recess, as explained hereinafter. Brackets 20 and 22, which are aligned with each other on opposite sides of the carrier recess, each include a lower guide member 26 which projects inwardly toward the recess and is shaped to fit into a corresponding notch in the periphery of the chip carrier as the carrier is loaded into the test socket, thereby guiding the carrier to its proper position in recess 4.

A pivot member 28, which cooperates with the base member to move a carrier clamp between open and clamping positions, includes a pair of spaced depending tabs 30 which are adapted to fit into respective slots 32 on opposite sides of recess 4 in the test socket base. Retainer pivot pins 36 extend through openings in the base on either side of slots 32 and also through openings 38 in the pivot member tabs to retain the pivot member on the base, leaving it free to pivot through an arc of approximately 90°. Pivot pins 36 may be threaded and screwed into corresponding threads in the base member, or otherwise held in place on the base.

The pivot member tabs 30 are connected by a bar 40 from which a ring 42 extends in the same plane. A clamp 44 is provided to clamp a chip carrier in the test socket and press the chip down to establish a firm contact with the spring contact members 10. Clamp 44 includes a central body portion 46 from which a post 48 depends. When assembled, post 48 extends through an opening 50 in the pivot member ring, and a clamp nut 52 is captured on the post below opening 50 to retain the clamp on the pivot member. The clamp further includes a pair of arms 54 which extend laterally outward from the central body portion. Each of the arms has a pair of side walls 56 that extend laterally outward from the body portion. The upper surfaces of the arms are tapered downward from an intermediate apex 58 located between the side walls; the tapered upper arm surfaces provide engagement surfaces which engage the base brackets to firmly clamp a chip and carrier in place when the clamp is rotated, as explained in further detail below. A finger grip 60 extends upward from the central body portion so that the clamp may be easily gripped and rotated by hand to effect a clamping action. A bore 62 extends through the finger grip, central body portion and post to provide an ambient temperature source for a chip held in a clamped carrier.

Figure 2:
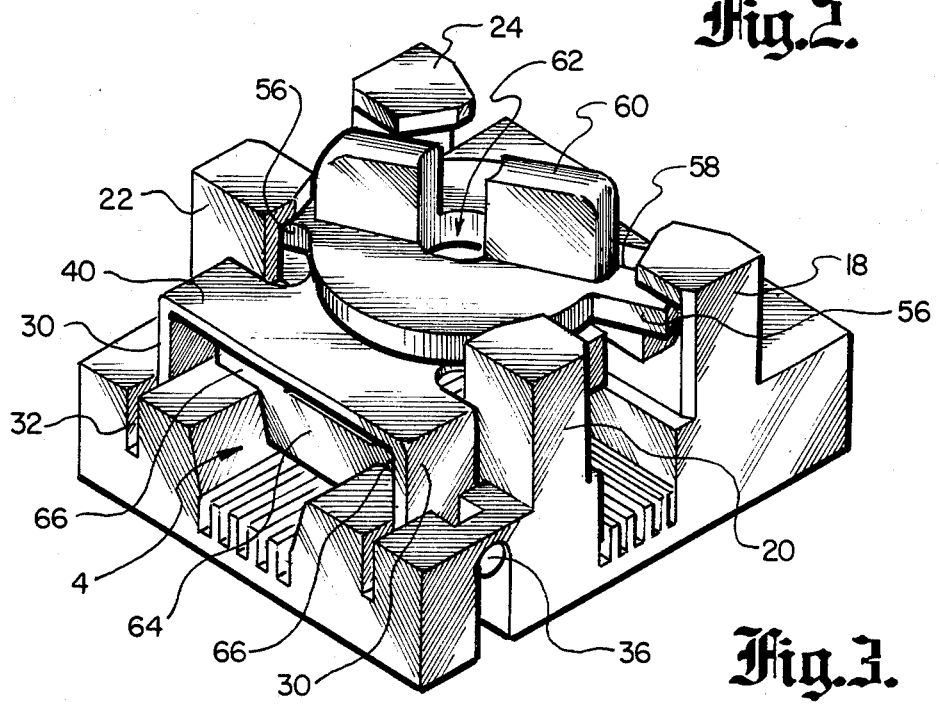
FIG. 2 is a perspective view of the test socket in a closed position clamping a leadless chip carrier in place.
Figure 3:
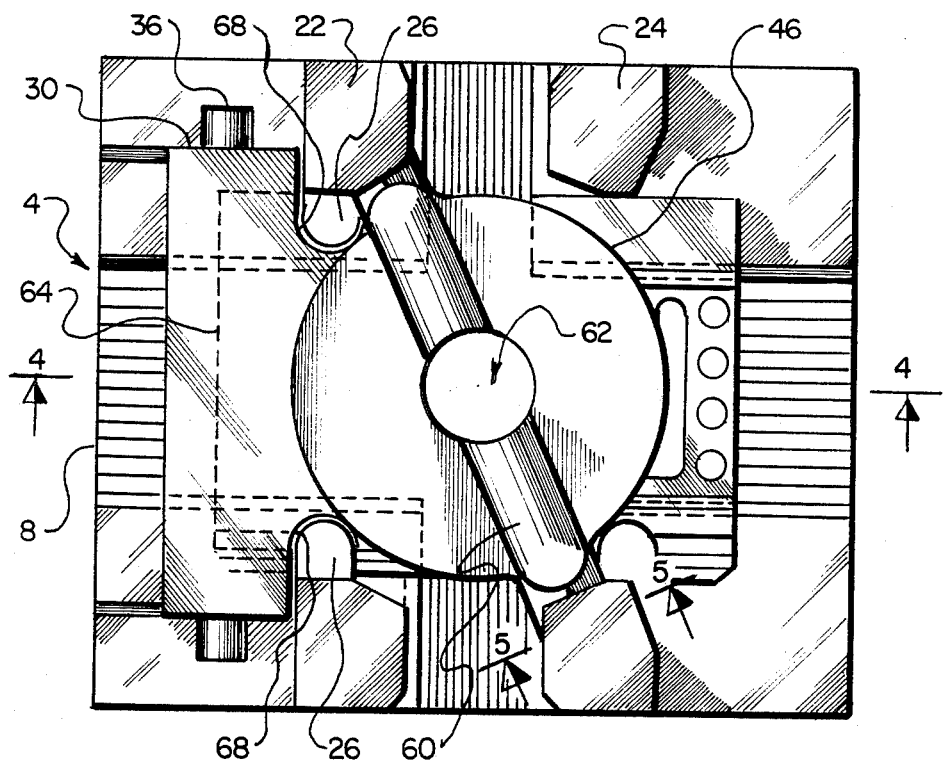
FIG. 3 is a plan view of the test socket and leadless chip carrier shown in FIG. 2.

FIGS. 2, 3 and 4 show a leadless chip carrier housing a chip and clamped within the test socket of FIG. 1. The carrier, which is illustrated as the one shown in U.S. Pat. No. 4,444,309, has a central portion 64 with a cavity 65 which receives a leadless chip, and a pair of wings 66 running along opposite sides of the central portion. The wings have notches 68 which align with guide members 26 to accurately locate the carrier within recess 4 in the test socket base. A leadless chip 70 is held within the carrier with its contact pads facing downward towards the floor of the test socket base in the orientation shown in the drawings (see FIG. 4). The chip carrier includes an opening through which clamp post 48 extends to make direct contact with the upper surface of the chip. Post 48 bears down against the chip as the clamp is tightened, pushing the chip down to establish a secure electrical contact between the contact springs 10 and their respective chip contact pads. The various parts are dimensioned such that the carrier bottoms out against the upper surface of partitions 8 to prevent damage from over-torqueing the clamp. As shown in FIG. 4, the contact spring pins 16 extend out through openings in the bottom of the test socket base for connection to a printed circuit board.

Further details of the clamping mechanism are illustrated in FIG. 5. The clamp is rotatable within pivot member 28 such that arms 54 may be brought under an opposed pair of the projecting brackets 18, 20, 22 and 24. As illustrated in FIG. 5, one of the arms 54 has been rotated to the position of bracket 18; the opposite arm is at bracket 22. The upper portion of the bracket is undercut to form a downward facing bearing surface 71 which is inclined upward at a slight angle, preferably about 2°, towards the side of the bracket (the direction from which clamp arm 54 is rotated to engage the bracket). As indicated by arrow 72 in FIG. 5, arm 54 traverses an arc from left to right to come into contact with the bracket. The bearing surface 71 on the opposite side of the bracket is inclined at a similar angle upward toward that side, such that the bearing surface is inclined upward toward whatever direction the clamp arm is coming from. The clamp's upper engagement surface, on the other hand, is inclined downward at a similar angle towards the bracket. Since the arm's engagement surface tapers downward toward both side walls 56 from intermediate apex 58, it can be seen that that surface will engage the bracket's bearing surface 71 at a net inclination of about 4°, regardless of whether the arm is rotated clockwise or counterclockwise into engagement with the bracket. This mutual inclination between the arms on either side of the clamp and their respective brackets forces the clamp body down as it is progressively rotated under the brackets. The downward movement of the clamp is in turn transmitted through post 48 to the leadless chip within the carrier, forcing it down to establish a positive engagement between the chip contact pads and the socket's spring contacts.

FIGS. 6–8 show the action of the contact springs 10 in establishing contact with the leadless chip pads. Before the chip carrier is inserted into the test socket, the contact springs are relaxed as shown in FIG. 7 with their head 12 protruding above the eventual position of the leadless chip, indicated by line 74. When the carrier is inserted and clamped in the test socket the chip is forced down against the contact springs, flexing them down to the position shown in FIGS. 6 and 8. In this position the carrier bottoms out on the upper surfaces of partitions 8, and the flex applied to the spring contacts establishes a secure connection between them and their respective chip contact pads. With the contact springs mutually insulated from each other by partitions 8, signals can then be applied to and from the chip via the contact springs for testing purposes.

In operation, the test socket's pivot member 28 is initially pivoted to an open position, exposing recess 4 in the test socket base. A carrier housing a leadless chip is then loaded generally from above the base member into the recess, where it is properly positioned by means of guide members 26. Pivot member 28 is then pivoted closed such that the clamp post 48 extends through the carrier opening to the upper surface of the chip, which has its contact pads facing downward. Finger grip 60 on the clamp is next grasped and turned to rotate the clamp either clockwise or counterclockwise. The opposite clamp arms 54 engage diametrically opposed brackets 18, and with continued rotation of the clamp force the post 48 down against the underlying leadless chip as a result of the angular engagement between the upper engagement surfaces on the clamp arms and the bearing surfaces on the brackets. Rotation of the clamp continues until the carrier has bottomed out on the upper surfaces of the base partitions 8, at which point secure electrical connections have been established between the chip and the test socket contact springs. Test signals can then be applied over the various contact springs to exercise the chip circuitry, with the results also read out over the contact springs.

A simple, easy to use and yet durable and reliable test socket which is capable of accommodating a leadless chip carrier has thus been shown and described. Since numerous modifications and alternate embodiments will occur to those skilled in the art, it is intended that the invention be limited on in terms of the appended claims.

I claim:

1. A test socket for a leadless chip carrier assembly, the assembly including a leadless chip and a carrier housing the chip, the carrier being adapted to hold a leadless chip in a cavity with the chip's contact pads exposed for probing, comprising (for a reference orientation with the chip contact pads facing downward):

a base member adapted to receive a chip carrier assembly with the exposed chip contact pads facing downward towards the base, a plurality of spring biased contact members extending upward from within the base member to establish electrical contact with respective contact pads of a chip in the carrier, a plurality of spaced projecting members extending upward from the base member to a level above the chip carrier assembly, each projecting member including a generally downward facing bearing surface, a pivot member pivotally retained on the base member for pivoting between an open position permitting the loading of a chip carrier assembly into the base member, and a closed position over the chip carrier assembly, and a rotatable clamp carried by and rotatable with respect to the pivot member, the clamp having an upper bearing member which fits between the projecting member bearing surfaces and the pivot member, the bearing member engaging the bearing surfaces of the projecting members and progressively forcing the pivot member more fully closed when the pivot member is at an initially closed position and the clamp is rotated, and the clamp further having a lower clamping member bearing against the chip carrier assembly and progressively urging it down to a positive engagement between the chip contact pads and the spring biased contact members when the clamp is rotated.

2. The test socket of claim 1, wherein the projecting members include undercut portions forming said bearing surfaces.

3. The test socket of claim 2, the clamp bearing member and the projecting member bearing surfaces being mutually inclined to the clamp rotation plane to force the clamp downward as it is rotated under the bearing surfaces.

4. The test socket of claim 1, wherein the clamp includes a central body portion, and the bearing member comprises a pair of arms extending laterally outward from the body portion.

5. The test socket of claim 4, wherein each of the arms includes a pair of side walls extending laterally outward from the body portion, the upper surfaces of the arms being tapered downward from an intermediate location between the side walls, the projecting member bearing surfaces being configured with respect to the tapered arms so that both clockwise and counterclockwise rotation of the clamp causes its arms to engage respective bearing surfaces and urge the clamp downward against an underlying chip carrier assembly.

6. The test socket of claim 4, the clamp further including a finger grip extending upward from the central body portion for rotating the clamp.

7. The test socket of claim 1, wherein the pivot member includes an opening generally centered over the chip carrier assembly in the closed position, and the lower clamping member comprises a post extending downward through said opening to contact the chip carrier assembly, the upper bearing member being formed on the portion of the clamp above the opening.

8. The test socket of claim 7, wherein the clamp post is dimensioned and disposed on the clamp to enter the cavity of an underlying chip carrier and bear directly against a chip held therein.

9. The test socket of claim 8, the clamp post including a through bore to provide an ambient temperature source for the chip.

10. The test socket of claim 7, the clamp being retained on the pivot member by means of a nut captured on the post below the pivot member opening.

11. The test socket of claim 1, the pivot member including a plurality of depending tabs at one end, the tabs having mutually aligned openings, the base member being adapted to receive said tabs, and further comprising a pivot pin extending through the base member and tab openings to pivotally capture the pivot member on the base member.

12. A test socket for a leadless chip carrier assembly, the assembly including a leadless chip and a carrier housing the chip, the carrier including a cavity for holding a leadless chip with the chip's contact pads exposed for probing, comprising (for a reference orientation with the chip contact pads facing downward):

a base member having a carrier receiving area adapted to receive a chip carrier assembly loaded generally from above the base member with the exposed chip contact pads facing downward towards the base, means attached to the base member for establishing electrical contact with respective contact pads of a chip in the carrier, a clamp means pivotably retained on the base member for pivoting about a first axis between an open position permitting the top loading of a chip carrier assembly into a base member, and a closed position over the chip carrier assembly, the clamp means being rotatable about a second axis which is substantially perpendicular to the first axis, and means carried by the base member and cooperating with the clamp means to releasably clamp the chip carrier assembly in place with the chip contact pads engaging the electrical contact means when the clamp means is pivoted closed and rotated.

13. The test socket of claim 12, the chip carrier receiving area comprising a recess in the base member, the recess being dimensioned so that its side walls prevent substantial lateral movement of the carrier assembly.

14. The test socket of claim 13, the chip carrier including a plurality of notches formed at predetermined positions around its periphery, and the test socket including a plurality of fixed guide members adapted to fit into at least some of said notches as the carrier assembly is loaded into the test socket and thereby guide the carrier assembly to a desired position on the base member.

15. The test socket of claim 12, the clamp means comprising a rotatable clamp member having an upper engagement surface, and the means cooperating with the clamp means comprises a plurality of spaced projecting members extending upward from the base member around the carrier receiving area, the projecting members including generally downward facing bearing surfaces which are engaged by the upper engagement surface of the clamp member when it is rotated to more fully close the clamp means on the chip carrier assembly.

16. The test socket of claim 15, wherein the projecting members include undercut portions forming said bearing surfaces.

17. The test socket of claim 16, the upper clamp engagement and projecting member bearing surfaces being mutually inclined to the clamp rotation plane to force the clamp downward as it is rotated under the bearing surfaces.

18. The test socket of claim 15, wherein the clamp includes a central body portion and a pair of arms extending laterally outward from the body portion, the upper clamp engagement surface being formed on the upper surfaces of said arms.

19. The test socket of claim 18, wherein each of the arms includes a pair of side walls extending laterally outward from the body portion, the upper surfaces of the arms being tapered downward from an intermediate location between the side walls, the projecting member bearing surfaces being configured with respect to the tapered arms so that both clockwise and counterclockwise rotation of the clamp causes its arms to engage respective bearing surfaces and urge the clamp downward against an underlying chip carrier assembly.

20. The test socket of claim 19, the clamp further including a finger grip extending upward from the central body portion and inward of said arms of rotating the clamp.

21. The test socket of claim 12, wherein the clamp means is dimensioned to enter the cavity of an underlying chip carrier and bear directly against a chip held therein.

22. The test socket of claim 21, the clamp means including a through bore extending to chip bearing surface to provide an ambient temperature source for the chip.

* * * * *